US008994195B2

(12) United States Patent
Haba et al.

(10) Patent No.: US 8,994,195 B2
(45) Date of Patent: *Mar. 31, 2015

(54) MICROELECTRONIC ASSEMBLY WITH IMPEDANCE CONTROLLED WIREBOND AND CONDUCTIVE REFERENCE ELEMENT

(71) Applicant: Tessera, Inc., San Jose, CA (US)

(72) Inventors: Belgacem Haba, Saratoga, CA (US); Brian Marcucci, Phoenix, AZ (US)

(73) Assignee: Tessera, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/071,055

(22) Filed: Nov. 4, 2013

(65) Prior Publication Data

US 2014/0103500 A1   Apr. 17, 2014

Related U.S. Application Data

(60) Continuation of application No. 12/986,556, filed on Jan. 7, 2011, now Pat. No. 8,575,766, which is a division of application No. 12/722,784, filed on Mar. 12, 2010, now Pat. No. 7,923,851.

(60) Provisional application No. 61/210,063, filed on Mar. 13, 2009.

(30) Foreign Application Priority Data

Sep. 22, 2009   (KR) .................. 10-2009-0089470

(51) Int. Cl.
*H01L 23/48* (2006.01)
*H01L 23/52* (2006.01)
(Continued)

(52) U.S. Cl.
CPC .......... *H01L 23/552* (2013.01); *H01L 23/3121* (2013.01); *H01L 23/3192* (2013.01);
(Continued)

(58) Field of Classification Search
None
See application file for complete search history.

(56) References Cited

U.S. PATENT DOCUMENTS

| 4,680,613 A | 7/1987 | Daniels et al. |
| 4,980,753 A | 12/1990 | Dunaway et al. |

(Continued)

FOREIGN PATENT DOCUMENTS

| CN | 101410974 A | 4/2009 |
| EP | 0915504 A1 | 5/1999 |

(Continued)

OTHER PUBLICATIONS

Japanese Office Action for Application No. 2011-554234 dated Jul. 12, 2013.

(Continued)

*Primary Examiner* — Wensing Kuo
*Assistant Examiner* — Shaka White
(74) *Attorney, Agent, or Firm* — Lerner, David, Littenberg, Krumholz & Mentlik, LLP

(57) ABSTRACT

A microelectronic assembly can include a microelectronic device having device contacts exposed at a surface thereof and an interconnection element having element contacts and having a face adjacent to the microelectronic device. Conductive elements, e.g., wirebonds connect the device contacts with the element contacts and have portions extending in runs above the surface of the microelectronic device. A conductive layer has a conductive surface disposed at at least a substantially uniform distance above or below the plurality of the runs of the conductive elements. In some cases, the conductive material can have first and second dimensions in first and second horizontal directions which are smaller than first and second corresponding dimensions of the microelectronic device. The conductive material is connectable to a source of reference potential so as to achieve a desired impedance for the conductive elements.

12 Claims, 16 Drawing Sheets

(51) Int. Cl.
*H01L 29/40* (2006.01)
*H01L 23/552* (2006.01)
*H01L 23/31* (2006.01)
*H01L 23/66* (2006.01)
*H01L 23/00* (2006.01)
*H01L 25/065* (2006.01)

(52) U.S. Cl.
CPC ............... *H01L23/66* (2013.01); *H01L 24/05* (2013.01); *H01L 24/06* (2013.01); *H01L 24/48* (2013.01); *H01L 24/49* (2013.01); *H01L 24/45* (2013.01); *H01L 25/0657* (2013.01); *H01L 2223/6611* (2013.01); *H01L 2223/6622* (2013.01); *H01L 2224/04042* (2013.01); *H01L 2224/05556* (2013.01); *H01L 2224/06136* (2013.01); *H01L 2224/32145* (2013.01); *H01L 2224/45015* (2013.01); *H01L 2224/45144* (2013.01); *H01L 2224/45147* (2013.01); *H01L 2224/4556* (2013.01); *H01L 2224/45565* (2013.01); *H01L 2224/45599* (2013.01); *H01L 2224/4809* (2013.01); *H01L 2224/48091* (2013.01); *H01L 2224/48095* (2013.01); *H01L 2224/48145* (2013.01); *H01L 2224/48227* (2013.01); *H01L 2224/4824* (2013.01); *H01L 2224/48464* (2013.01); *H01L 2224/48471* (2013.01); *H01L 2224/48505* (2013.01); *H01L 2224/48599* (2013.01); *H01L 2224/49052* (2013.01); *H01L 2224/49175* (2013.01); *H01L 2224/85045* (2013.01); *H01L 2224/8592* (2013.01); *H01L 2924/01005* (2013.01); *H01L 2924/01015* (2013.01); *H01L 2924/01029* (2013.01); *H01L 2924/0103* (2013.01); *H01L 2924/01047* (2013.01); *H01L 2924/01078* (2013.01); *H01L 2924/01079* (2013.01); *H01L 2924/01082* (2013.01); *H01L 2924/014* (2013.01); *H01L 2924/19107* (2013.01); *H01L 2924/20752* (2013.01); *H01L 2924/30107* (2013.01); *H01L 2924/3011* (2013.01); *H01L 2924/3025* (2013.01); *H01L 2924/01006* (2013.01); *H01L 2924/01019* (2013.01); *H01L 2924/01023* (2013.01); *H01L 2924/01033* (2013.01); *H01L 2224/45139* (2013.01); *H01L 2224/48799* (2013.01); *H01L 2224/49176* (2013.01); *H01L 2224/49095* (2013.01); *H01L 2224/05554* (2013.01)
USPC .................... 257/784; 257/E23.024; 438/106

(56) References Cited

U.S. PATENT DOCUMENTS

| | | | |
|---|---|---|---|
| 5,028,983 A | 7/1991 | Bickford et al. |
| 5,065,282 A | 11/1991 | Polonio |
| 5,343,074 A | 8/1994 | Higgins, III et al. |
| 5,394,010 A | 2/1995 | Tazawa et al. |
| 5,468,999 A | 11/1995 | Lin et al. |
| 5,471,151 A | 11/1995 | DiFrancesco |
| 5,523,621 A | 6/1996 | Kikuchi |
| 5,552,631 A | 9/1996 | McCormick |
| 5,606,196 A | 2/1997 | Lee et al. |
| 5,638,596 A | 6/1997 | McCormick |
| 5,639,989 A | 6/1997 | Higgins, III |
| 5,835,988 A | 11/1998 | Ishii |
| 5,880,403 A | 3/1999 | Czajkowski et al. |
| 6,001,671 A | 12/1999 | Fjelstad |
| 6,326,678 B1 | 12/2001 | Karnezos et al. |
| 6,445,594 B1 | 9/2002 | Nakagawa et al. |
| 6,476,506 B1 | 11/2002 | O'Connor et al. |
| 6,518,659 B1 | 2/2003 | Glenn |
| 6,538,336 B1 | 3/2003 | Secker et al. |
| 6,552,417 B2 | 4/2003 | Combs |
| 6,667,546 B2 | 12/2003 | Huang et al. |
| 6,770,822 B2 | 8/2004 | Pasternak et al. |
| 6,812,580 B1 * | 11/2004 | Wenzel et al. ............... 257/784 |
| 7,166,495 B2 | 1/2007 | Ball |
| 7,205,651 B2 | 4/2007 | Do et al. |
| 7,217,997 B2 | 5/2007 | Wyland |
| 7,303,113 B2 | 12/2007 | Kwark et al. |
| 7,450,110 B2 | 11/2008 | Shahoian et al. |
| 7,456,505 B2 | 11/2008 | Gospodinova et al. |
| 7,466,021 B2 | 12/2008 | Fjelstad |
| 7,468,560 B2 | 12/2008 | Guengerich et al. |
| 7,528,011 B2 | 5/2009 | Yano et al. |
| 7,537,962 B2 | 5/2009 | Jang et al. |
| 7,723,852 B1 | 5/2010 | Kim et al. |
| 7,727,801 B2 | 6/2010 | Saran |
| 7,768,135 B1 | 8/2010 | St. Amand et al. |
| 7,843,021 B2 | 11/2010 | Zhe et al. |
| 7,855,463 B2 | 12/2010 | Brox et al. |
| 7,875,985 B2 | 1/2011 | Hiller et al. |
| 7,923,851 B2 | 4/2011 | Haba et al. |
| 8,026,129 B2 | 9/2011 | Cablao et al. |
| 8,222,725 B2 | 7/2012 | Haba et al. |
| 8,237,250 B2 | 8/2012 | Chang Chien et al. |
| 8,243,465 B2 | 8/2012 | Itaya et al. |
| 8,253,258 B2 | 8/2012 | Sonobe et al. |
| 8,294,249 B2 | 10/2012 | Pilling et al. |
| 8,575,766 B2 * | 11/2013 | Haba et al. ............... 257/784 |
| 2001/0015490 A1 | 8/2001 | Lee |
| 2003/0090001 A1 | 5/2003 | Beatson et al. |
| 2004/0164389 A1 | 8/2004 | Lee |
| 2004/0238939 A1 | 12/2004 | Wu |
| 2005/0006742 A1 | 1/2005 | Sugiyama et al. |
| 2005/0045378 A1 | 3/2005 | Heng et al. |
| 2005/0098870 A1 | 5/2005 | Thomas et al. |
| 2005/0116013 A1 | 6/2005 | Kwark et al. |
| 2006/0049505 A1 | 3/2006 | Wyland |
| 2006/0125079 A1 | 6/2006 | Wyland et al. |
| 2006/0131742 A1 | 6/2006 | Tzu |
| 2006/0145308 A1 | 7/2006 | Floyd et al. |
| 2006/0175712 A1 | 8/2006 | Lyn et al. |
| 2006/0180916 A1 | 8/2006 | Wyland |
| 2007/0007644 A1 | 1/2007 | Zhao et al. |
| 2007/0034674 A1 | 2/2007 | Mii et al. |
| 2007/0105272 A1 | 5/2007 | Lee et al. |
| 2007/0170601 A1 | 7/2007 | Miyaki et al. |
| 2008/0088012 A1 | 4/2008 | Ohkawa |
| 2008/0111248 A1 | 5/2008 | Foong et al. |
| 2009/0256266 A1 | 10/2009 | Lao et al. |
| 2010/0230828 A1 | 9/2010 | Haba et al. |
| 2010/0232128 A1 | 9/2010 | Haba et al. |
| 2010/0270667 A1 | 10/2010 | Tong et al. |
| 2012/0068317 A1 | 3/2012 | Haba et al. |
| 2012/0068338 A1 | 3/2012 | Haba et al. |
| 2012/0068361 A1 | 3/2012 | Haba |

FOREIGN PATENT DOCUMENTS

| | | |
|---|---|---|
| EP | 1770777 A2 | 4/2007 |
| JP | 06-268100 A | 9/1994 |
| JP | 7058138 A | 3/1995 |
| JP | 9-027512 A | 1/1997 |
| JP | 2000021926 A | 1/2000 |
| JP | 2000332160 A | 11/2000 |
| JP | 2001007140 A | 1/2001 |
| JP | 2001339016 A | 12/2001 |
| JP | 2004112143 A | 4/2004 |
| JP | 2006216823 A | 8/2006 |
| KR | 100270817 B1 | 11/2000 |
| KR | 20050002659 A | 1/2005 |
| KR | 100702970 A | 1/2007 |
| KR | 100935854 B1 | 1/2010 |
| KR | 100950511 B1 | 3/2010 |
| WO | 2005010989 A1 | 2/2005 |

(56) References Cited

FOREIGN PATENT DOCUMENTS

| WO | 2008/008948 A2 | 1/2008 |
|---|---|---|
| WO | 2010020836 A1 | 2/2010 |

OTHER PUBLICATIONS

Chinese Office Action for Application No. 201080020828.3 dated Jul. 29, 2013.
Chinese Office Action for Application No. 201080020851.2 dated Nov. 28, 2013.
International Search Report Application No. PCT/US2010/027135, dated Aug. 30, 2011.
International Search Report, PCT/US2010/027141, dated Jan. 6, 2012.
Partial International Search Report and Invitation to Pay Additional Fees, PCT/US2010/027135, dated Mar. 21, 2011.
Partial International Search Report and Invitation to Pay Additional Fees, PCT/US2010/027141, dated Jan. 27, 2011.
Taiwan Office Action for Application No. 099107377 dated Feb. 18, 2013.
U.S. Appl. No. 12/883,556, filed Sep. 16, 2010.
U.S. Appl. No. 12/883,612, filed Sep. 16, 2010.
U.S. Appl. No. 12/883,811, filed Sep. 16, 2010.
U.S. Appl. No. 12/883,821, filed Sep. 16, 2010.
Japanese Office Action for Application No. 2011-554232 dated Feb. 4, 2014.

* cited by examiner

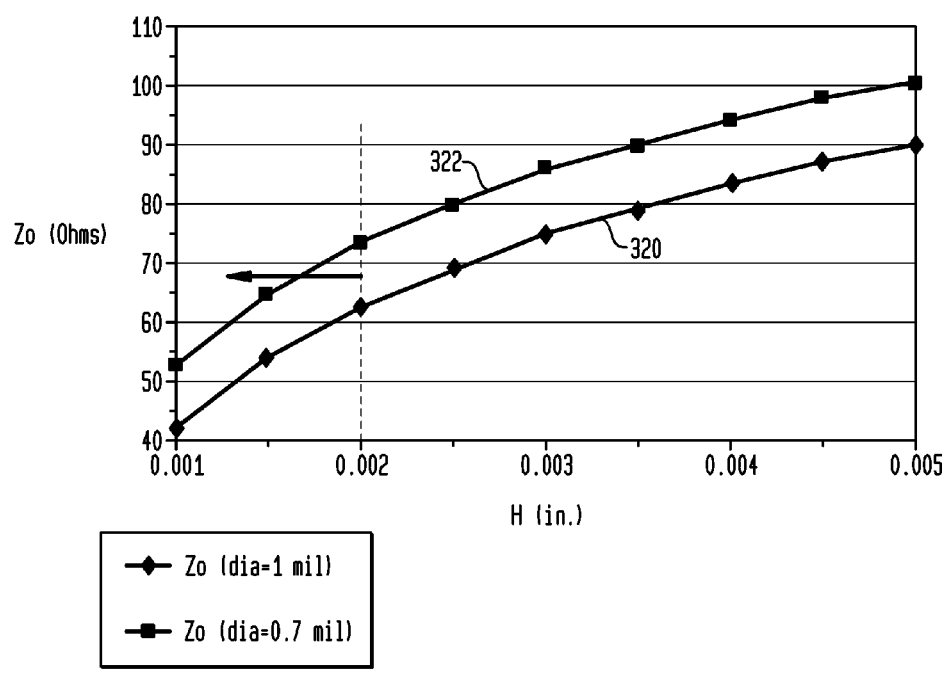

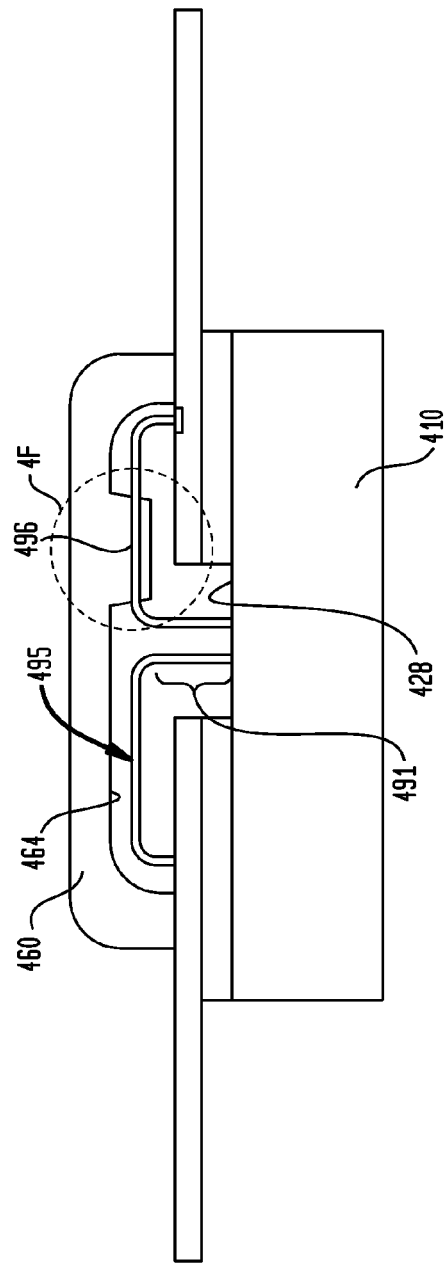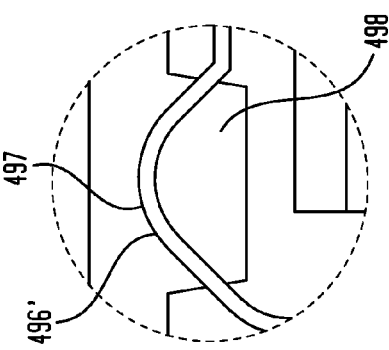

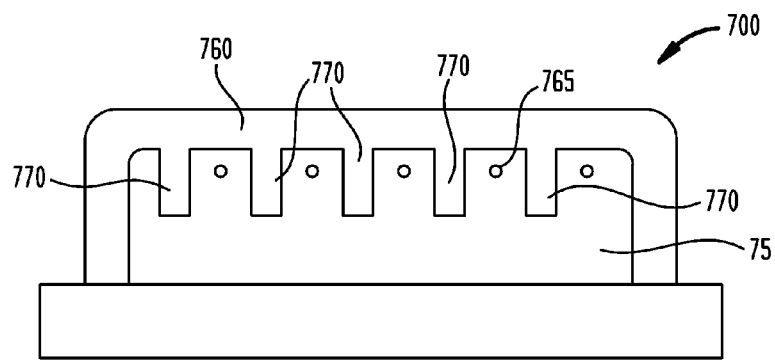
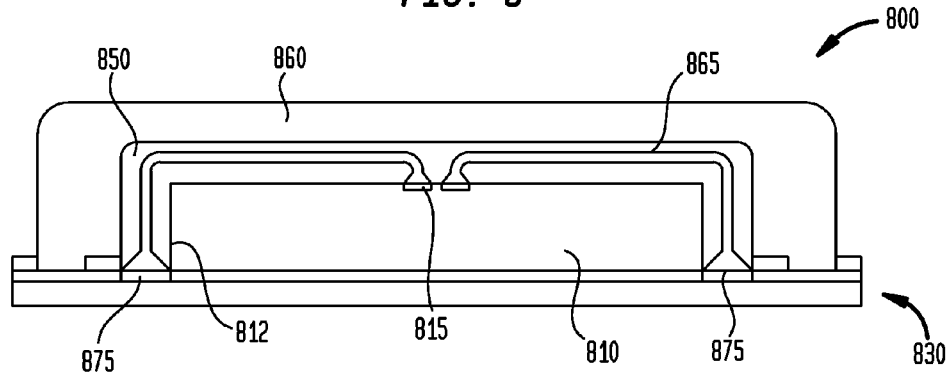

MICROELECTRONIC ASSEMBLY WITH IMPEDANCE CONTROLLED WIREBOND AND CONDUCTIVE REFERENCE ELEMENT

CROSS-REFERENCE TO RELATED APPLICATIONS

This application is a continuation of U.S. application Ser. No. 12/986,556, filed on Jan. 7, 2011 which is a divisional of U.S. application Ser. No. 12/722,784, filed on Mar. 12, 2010. U.S. application Ser. No. 12/722,784 claims priority from Korean Application No. 10-2009-0089470 filed Sep. 22, 2009 and claims the benefit of U.S. Provisional Patent Application No. 61/210,063 filed Mar. 13, 2009, all of which are hereby incorporated herein by reference.

BACKGROUND OF THE INVENTION

Microelectronic chips are typically flat bodies with oppositely facing, generally planar front and rear surfaces with edges extending between these surfaces. Chips generally have contacts, sometimes also referred to as pads or bond pads, on the front surface which are electrically connected to the circuits within the chip. Chips are typically packaged by enclosing them with a suitable material to form microelectronic packages having terminals that are electrically connected to the chip contacts. The package may then be connected to test equipment to determine whether the packaged device conforms to a desired performance standard. Once tested, the package may be connected to a larger circuit (e.g. a circuit in an electronic product such as a computer or a cell phone) by connecting the package terminals to matching lands on a printed circuit board (PCB) by a suitable connection method such as soldering.

Microelectronic packages may be fabricated at the wafer level; that is, the enclosure, terminations and other features that constitute the package, are fabricated while the chips, or die, are still in a wafer form. After the die have been formed, the wafer is subject to a number of additional process steps to form the package structure on the wafer, and the wafer is then diced to free the individually packaged die. Wafer level processing can be an efficient fabrication method because the footprint of each die package may be made identical, or nearly identical, to the size of the die itself, resulting in very efficient utilization of area on the printed circuit board to which the packaged die is attached.

A common technique for forming electrically conductive connections between a microelectronic chip and one or more other electronic components is through wire-bonding. Conventionally, a wirebonding tool attaches the end of a wire to a pad on a microelectronic chip using thermal and/or ultrasonic energy and then loops the wire to a contact on the other electronic component and forms a second bond thereto using thermal and/or ultrasonic forces.

SUMMARY

The inventors have recognized that one of the problems with wire-bond technology is that electromagnetic transmissions along a wire can extend into space surrounding the wire, inducing currents in nearby conductors and causing unwanted radiation and detuning of the line. Wire-bonds generally are also subject to self-inductances and are subject to external noise (e.g. from nearby electronic components). In the end, this creates electrical impedance problems. These problems can become more serious as the pitch between contacts on microelectronic chips and other electronic components becomes smaller, as the chips operate at higher frequencies, and as the use of multiple raw pads becomes more common.

Various structures and techniques for manufacturing are described herein for a microelectronic assembly. A microelectronic assembly, according to one embodiment, includes a microelectronic device wire-bonded to one or more interconnection elements, e.g., microelectronic subassemblies, such as for example, a substrate, chip carrier, tape, etc. The wire-bond between the microelectronic device and the one or more other interconnection elements, in one embodiment, is formed using an insulated wire. The insulated wire can be a wire provided with an insulative sheath, such as may be provided by coating the wire with an insulating material. After wire-bond is conductively connected to a contact of the microelectronic device and a corresponding contact of a interconnection element, a sufficient amount of insulating material can be dispensed onto ends of the wire-bond to insulate any exposed portions of the contacts and any exposed conductive portions of the wire-bond at the ends.

The insulative coating of the wire-bond may be relatively thin when the wire-bond is initially formed on the chip. For example, insulative sheathing which is available on the bonding wire may have a thickness of only about one micron to a few microns. The thickness of the sheathing may be such that the sheathing can be easily consumed when a wire-bonding tool applies heat or a flame to an exposed tip of the bonding wire before attaching the tip to a contact of a device or an interconnection element to form one end of the wire-bond. After attaching the wire-bond to contacts of both the device and the interconnection element, a process can be applied to the wire-bonds to grow the insulative coating to a desirable thickness. For example, certain insulative materials can have an affinity for molecules in a liquid composition, such that when exposed to such liquid composition, molecules can selectively aggregate upon the insulative coating to cause the thickness of the insulative coating to increase. In one embodiment, the thickness of the insulative coating can be at least about 30 micrometers (microns) in order to achieve a desirable separation distance between the insulated wire-bond and a conductive material to be used as a reference conductor therefor. The separation distance is a factor which, along with the cross-sectional dimension, e.g., diameter, of the wire-bond, partly determines the impedance of the wire-bond structure. The thickness of the insulative coating can be greater, e.g., 50 microns, 75 microns, 100 microns, or another value, depending on the impedance to be achieved.

Then, conductive encapsulant can be dispensed over the wire-bond to fill a volume surrounding the insulatively coated wire-bonds. The conductive encapsulant may electrically contact an exposed pad on the microelectronic device, a corresponding interconnection element, or both in order to connect to a reference voltage such as ground, power or other voltage which is at least stable in relation to frequencies of interest to operation of the microelectronic device. The conductive encapsulant provides a number of advantages for the microelectronic assembly. For example, it may provide shielding and mechanical protection for the wire. In some implementations, additional layers (both conductive and nonconductive) may be applied over the conductive encapsulant.

In another embodiment, a non-insulated wire is used to form the wire-bond between the microelectronic device and the one or more interconnection elements. After attaching the wire-bond at both ends, a dielectric material can be dispensed onto the non-insulated wire-bond to cover the ends and the length of wire in between. The dielectric material can provide insulation, shielding, and mechanical protection for the non-insulated wire. Once the dielectric material has been dispensed, a conductive layer is applied over the dielectric material. The characteristics, e.g., dimensions and surface contours of the conductive layer can be chosen in accordance with the characteristic impedance of the transmission line which is to be achieved, e.g., in accordance with requirements of the underlying circuitry. In addition, the conductive layer can be connected to an exposed pad on the microelectronic device and or on the one or more interconnection elements in order to provide connection to a source of reference voltage such as ground, power or other voltage which is at least stable in relation to frequencies of interest to operation of the microelectronic device.

In one embodiment, in a microelectronic assembly, a non-insulated wire can directly contact the conductive layer to provide further conductive interconnection between the stable, e.g., ground or power, reference of the conductive layer with a corresponding ground or power contact of the microelectronic device.

In one embodiment, the conductive layer has a conductive surface which is disposed at an at least substantially uniform distance which is at least one of above or below runs of the conductive elements or wirebonds.

In accordance with an embodiment, a microelectronic assembly is provided which can include a microelectronic device which has a surface and device contacts exposed at the surface. The surface can have a first dimension in a first direction and a second dimension in a second direction transverse to the first direction. The microelectronic assembly also includes an interconnection element having a face adjacent to the microelectronic device and having a plurality of element contacts. A plurality of conductive elements can connect the device contacts with the element contacts, such conductive elements having substantial portions extending in runs above the surface of the microelectronic device. A conductive material having a conductive surface can be disposed at at least a substantially uniform distance at least one of above or below the plurality of the runs. Dimensions of the conductive material including a first dimension in the first direction and a second dimension in the second direction may be smaller than the first and second dimensions of the microelectronic device. Such conductive material can be connectable to a source of reference potential, such that a desired impedance is achieved for the conductive elements.

In accordance with an embodiment, a microelectronic assembly is provided which includes a microelectronic device having a surface and device contacts exposed at the surface. The assembly can further include an interconnection element having a face adjacent to the microelectronic device and a plurality of element contacts. A plurality of conductive elements can connect the device contacts with the element contacts, the conductive elements having runs extending above the surface of the microelectronic device. A conductive material having a conductive surface can be disposed at at least a substantially uniform distance from at least substantial portions of the lengths of the conductive elements in at least one of a direction above the conductive elements or below the conductive elements. The conductive material can be connectable to a source of reference potential, such that a desired impedance is achieved for the conductive elements. The conductive surface may further define a plane at least substantially parallel to a plane in which the conductive elements run.

In accordance with one embodiment, the conductive surface can overlie a plurality of the runs of the conductive elements. In a particular embodiment, the conductive surface can be at least generally planar. In one embodiment, the conductive surface can be canted at an angle relative to the surface of the microelectronic device.

The conductive elements can be arranged such that the plurality of runs include at least portions of bond wires. In a particular embodiment, the conductive elements can be bond wires.

In one embodiment, the bond wires can extend as a plurality of connected steps, and the conductive surface may extend stepwise at least substantially parallel to the plurality of steps of the bond wires.

The interconnection element can include a dielectric element. In one embodiment, the interconnection element can include a reference contact which is connectable to the source of reference potential, and the conductive material can be conductively connected with the reference contact to form an electrically conductive connection.

In a particular embodiment, the dielectric element can include a polymeric element having a thickness of less than 200 microns, as determined in a direction away from the surface of the microelectronic element. In one embodiment, the polymeric element can be a sheet-like element, and can be flexible or non-flexible. In one embodiment, the conductive elements can be metallurgically bonded to the chip contacts.

In one embodiment, the conductive surface can be separated from the plurality of runs of the bond wires by insulating material. The insulating material can be such as to at least substantially fill a volume in which the plurality of runs of the bond wires extend through the volume.

The conductive material can be joined to a reference contact which is exposed at a surface of the interconnection element and can, in one embodiment, conform to the surface of the interconnection element. The interconnection element may include a conductor electrically connecting the reference contact to a source of reference potential.

A reference conductive element of the microelectronic assembly can have a run which extends in a direction along the surface of the microelectronic device. In one embodiment, the conductive material can be joined to the run of the reference conductive element.

In one embodiment, the conductive material can have an at least generally planar conductive surface and such surface can be spaced an at least substantially uniform distance from the conductive elements by dielectric, i.e., insulating material. The conductive material may include a connecting portion which is disposed below the at least generally planar conductive surface. In one embodiment, the connecting portion can have a mechanical connection and electrically conductive connection to the reference conductive element.

In a particular embodiment, the run of the reference conductive element may lie at least substantially in the same plane as the plurality of runs of the conductive elements.

In one embodiment, the insulating material can have an exterior surface and a plurality of inwardly extending grooves along the exterior surface thereof, and the conductive material can be disposed within the grooves. Such grooves can include grooves which are disposed adjacent to rising portions of the bond wires that are connected to the device contacts.

In a particular embodiment, the bond wires can include portions which extend in first directions along a major surface of the microelectronic device. The grooves in such case can include grooves which extend in the first directions between the laterally extending bond wire portions.

In one embodiment, edges of the conductive material can be disposed adjacent to edges of the interconnection element.

In a particular embodiment, device contacts can be exposed at a front surface of the microelectronic device and the microelectronic device can have a rear surface remote from the front surface and edges which extend between the front and rear surfaces. The rear surface can be mounted to the interconnection element, and the conductive elements can extend beyond the edges of the microelectronic device.

In accordance with one embodiment of the invention, a microelectronic assembly is provided which includes a microelectronic device having a front surface, a rear surface remote therefrom, and one or more surface conductive elements which extend along the front surface, the microelectronic device having device contacts exposed at the front surface. An interconnection element of the assembly can include a dielectric element underlying the rear surface of the microelectronic device, such interconnection element having a plurality of element contacts thereon. A plurality of raised conductive elements can connect the device contacts with the element contacts. The raised conductive elements may have substantial portions which extend in runs spaced a first height from the surface conductive elements and at least generally parallel to the one or more surface conductive elements. In such embodiment, one or more surface conductive elements can be connectable to a source of reference potential, such that a desired impedance is achieved for the raised conductive elements.

In accordance with such embodiment, one or more surface conductive elements can include a metal layer bonded to the front surface of the microelectronic device. An adhesive can bond the one or more surface conductive elements to the front surface of the microelectronic device. In one embodiment, the metal layer may include openings, wherein the surface conductive elements connect to the device contacts through the openings in the metal layer.

In accordance with one embodiment, a microelectronic assembly is provided which includes a microelectronic device having a surface and device contacts exposed at such surface. An interconnection element of the assembly can have a face adjacent to the microelectronic device and have a plurality of element contacts. A plurality of bond wires can connect the device contacts with the element contacts. Insulating material may sheathe individual ones of the bond wires, such insulating material typically having a thickness greater than about 30 microns, such thickness being at least substantially uniform along substantial lengths of the conductive elements. The assembly can further include a conductive material which conforms to the exterior surfaces of the insulating material and fills a volume between the insulatively sheathed bond wires. Such conductive material can be connectable to a source of reference potential, such that a desired impedance is achieved for the conductive elements.

In a particular embodiment, insulative masses can be provided which separated at least the device contacts from the conductive material. The assembly may further include additional insulative masses which separate at least the element contacts from the conductive material.

BRIEF DESCRIPTION OF DRAWINGS

FIG. 3D is a diagram graphing characteristic impedance $Z_O$ relative to separation height H for different diameters of bond wire, in accordance with an embodiment.

FIG. 4E is a sectional view illustrating a microelectronic assembly in accordance with a variation of the embodiment illustrated in FIG. 4C.

FIG. 4F is a partial sectional view illustrating a variation of the embodiment illustrated in FIG. 4E.

FIG. 7 is a sectional view transverse to the sectional illustrated in FIG. 6, illustrating a variation of the embodiment illustrated in FIGS. 3A-C.

FIG. 8 is a sectional view illustrating a microelectronic assembly in accordance with a variation of the embodiment illustrated in FIGS. 3A-C.

DETAILED DESCRIPTION

Figure 1A:
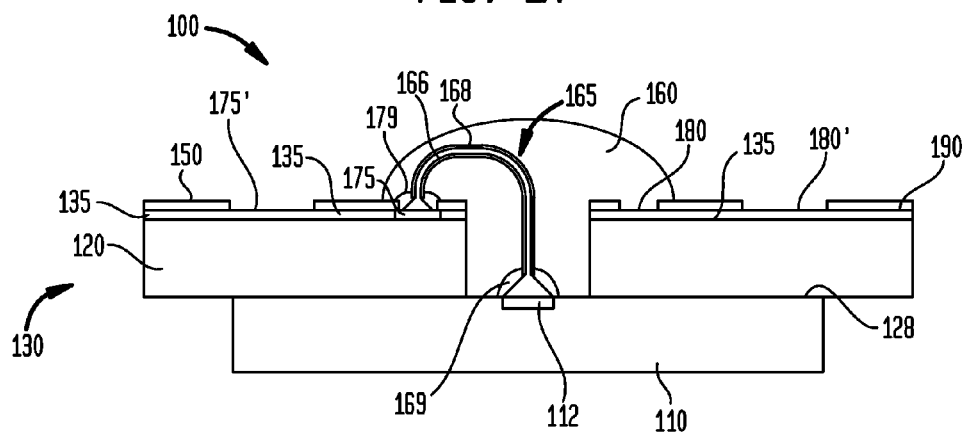
FIG. 1A is a sectional view of a microelectronic assembly in accordance with an embodiment.
Figure 1B:
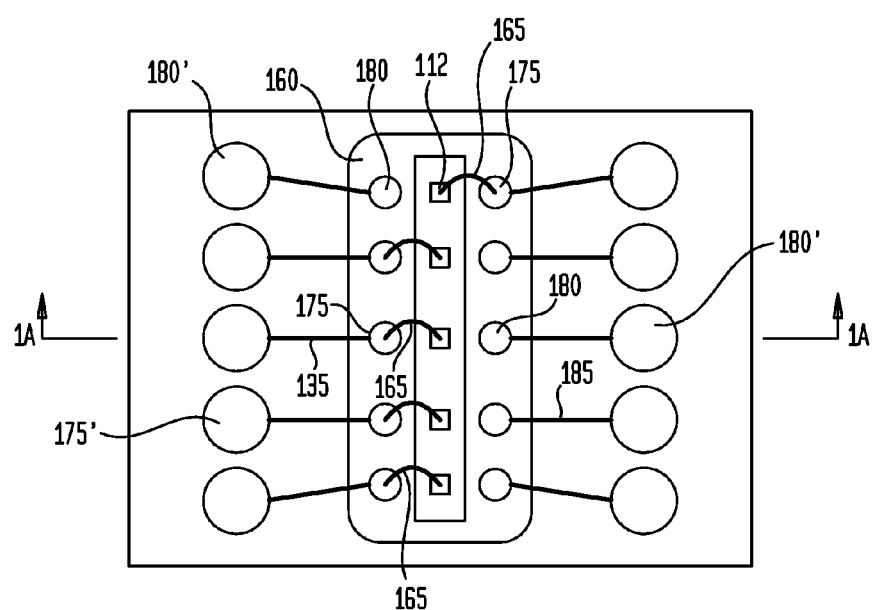
FIG. 1B is a plan view corresponding to the sectional view of FIG. 1A.

FIG. 1A shows a sectional view of an example microelectronic assembly 100, according to one embodiment. FIG. 1B is a corresponding plan view from above, in which the view in FIG. 1A is through section line 1A-1A of FIG. 1B. In this example, microelectronic assembly 100 includes a microelectronic device 110 conductively connected to interconnection element 130 through a wire bond 165. The microelectronic assembly 100 differs from conventional arrangements in that it includes a conductor 166 which is insulatively sheathed by an insulative (dielectric) coating 168. Beyond the dielectric coating 168, a conductive encapsulant 160 covers and at least substantially surrounds the wire bond 165. Thus, the conductive encapsulant 160 is disposed at an at least relatively uniform distance (which can be a uniform distance) from the internal conductor 166, such that the conductive encapsulant can act as a reference conductor in a transmission line that includes the central conductor 166 and the conductive encapsulant 160.

Microelectronic device 110 can be a single "bare", i.e., unpackaged die, e.g., a semiconductor chip having microelectronic circuitry thereon. In alternative embodiments, microelectronic device 110 can include a packaged semiconductor die. Initially, a plurality of contacts 112 are exposed at a surface 128 of the microelectronic device. For example, a plurality of contacts 112 can be exposed at a contact-bearing surface of a semiconductor die and may be arranged in one or more rows exposed at such surface.

For ease of reference, directions are stated in this disclosure with reference to a "top", i.e., contact-bearing surface 128 of a semiconductor chip 110. Generally, directions referred to as "upward" or "rising from" shall refer to the direction orthogonal and away from the chip top surface 128. Directions referred to as "downward" shall refer to the directions orthogonal to the chip top surface 128 and opposite the upward direction. A "vertical" direction shall refer to a direction orthogonal to the chip top surface. The term "above" a reference point shall refer to a point upward of the reference point, and the term "below" a reference point shall refer to a point downward of the reference point. The "top" of any individual element shall refer to the point or points of that element which extend furthest in the upward direction, and the term "bottom" of any element shall refer to the point or points of that element which extend furthest in the downward direction.

Interconnection element 130, as shown in FIG. 1A is capable of being connected with microelectronic device by electrically conductive interconnections. For example, the interconnection element can be an element of a package having a plurality of conductive leads or traces 135, a plurality of first contacts 175, 180 connected to the leads or traces arranged generally at first locations for interconnection with the microelectronic device, and a plurality of second contacts 175', 180' arranged generally at second locations, for example, for interconnection to another element such as for external interconnection to a printed circuit board. Alternatively, the interconnection element can be another microelectronic device or a unit including one or more such devices, among others. The interconnection element 130 may include a solder mask or other dielectric film 150 which can at least partially cover traces 135, while exposing contacts for forming the conductive interconnections.

In the example illustrated in FIG. 1A, contacts 175, 175' can carry signals, i.e., voltages or currents which vary with time and which typically convey information. For example, without limitation, voltages or currents which vary with time and which represent state, change, a measurement, a clock or timing input or a control or feedback input are examples of signals. On the other hand, contacts 180, 180' can provide connections to ground or a power supply voltage. A connection to ground or a power supply voltage typically provides a reference in a circuit to a voltage which is at least fairly stable with time over frequencies of interest to the operation of the circuit. Prior to forming conductive interconnections between the microelectronic device and the interconnection element, the contacts 175, 175', 180, 180' are exposed at an outwardly-directed face 190 of the interconnection element 130. As used in this disclosure, a statement that an electrically conductive structure is "exposed at" a surface of a dielectric structure indicates that the electrically conductive structure is available for contact with a theoretical point moving in a direction perpendicular to the surface of the dielectric structure toward the surface of the dielectric structure from outside the dielectric structure. Thus, a terminal or other conductive structure which is exposed at a surface of a dielectric structure may project from such surface; may be flush with such surface; or may be recessed relative to such surface and exposed through a hole or depression in the dielectric.

In one particular embodiment, the interconnection element can include a "substrate", e.g., a dielectric element bearing a plurality of traces and contacts. Without limitation, one particular example of a substrate can be a sheet-like flexible dielectric element, typically made of a polymer, e.g., polyimide, among others, having metal traces and contacts patterned thereon, the contacts being exposed at at least one face of the dielectric element. In one embodiment, the dielectric element can have a thickness of 200 micrometers or less in a direction extending away from the surface 128 of the microelectronic device.

Referring to FIGS. 1A-B, a interconnection element 130 having a dielectric element 120 has electrically conductive interconnections with a microelectronic device 110 through wirebonds 165. The wirebonds can be formed using insulated wires. A wire-bond using an insulated wire can have advantages over other types of wire-bonds. For example, the insulated wire can prevent short circuiting if wires should cross and can provide mechanical protection or reinforcement for the wires that might not be available otherwise. In accordance with one embodiment, a process for attaching an insulated wire from a microelectronic device to a interconnection element will now described with reference to FIGS. 1A-B.

The insulative coating 168 of the wire bond 165 can have a thickness selected in accordance with a dimension (e.g., a diameter) of the wire 166. The thickness of the insulative coating can be determined as the dimension of the coating in an orthogonal direction away from an exterior surface of a central conductive metallic core of the wire. In a particular embodiment, the diameter of the central metallic core of the wire can be about 1 mil (0.001 inch) or less, a measurement equivalent to about 30 micrometers or less (hereinafter, references to micrometers are stated alternatively as "micrometers", "microns" or "v"). In one embodiment, the thickness of the insulative coating can be selected to have a thickness between about 30 microns and about 75 microns, i.e., between about 1 and 3 mils. The wire 166 is conductively and mechanically connected to a contact 175 of interconnection element 130 and to a contact 125, e.g., a bond pad on microelectronic device 110. The device contacts to which insulated wire 165 connects can be a signal pad or a ground pad of the microelectronic device. A wire-bond can be formed by joining a metal wire typically gold or copper, the wire having an insulating coating, to a contact 112 on the microelectronic device 110, then drawing the wire and attaching it to a corresponding contact or contact 175 of interconnection element 130. Alternatively, the wire may be joined to the pad of the subassembly 130 first and joined to the contact of the microelectronic device 110 thereafter.

In one embodiment, a wirebond 165 can be formed using a wire having a layer of insulation pre-formed thereon, such wire being provided on a feed spool to an automated wire-bonder. The insulative coating as provided on the wire fed to the wire-bonder may have a rather small thickness, for example, a thickness of one to a few microns. In such case, when joining the insulated wire, the insulative coating at the tip of the wire can be flamed away by the wire-bonder equipment just prior to forming the joint with each contact. The insulative coating of the wire-bond 165 may be relatively thin when the wire-bond is initially formed on the chip. For example, an insulative coating which is available on the bonding wire may have a thickness of only about one micron to a few microns. The thickness of the sheathing may be such that the sheathing can be easily consumed when a wire-bonding tool applies heat or a flame to an exposed tip of the bonding wire before attaching the tip to a contact of a device or subassembly to form one end of the wire-bond.

After attaching the wire-bond to contacts of both the device and the subassembly, a process can be applied to the wire-bonds to add a further insulative layer to the insulative coating such that the coating grows to a desirable thickness. For example, certain insulative materials can have an affinity for molecules in a liquid composition, such that when exposed to such liquid composition, molecules can selectively aggregate upon the insulative coating to cause the thickness of the insulative coating to increase. In one embodiment, the thickness of the insulative coating can be at least about 30 microns in order to achieve a desirable separation distance between the insulated wire-bond and a conductive material to be used as a reference conductor therefor. The separation distance is a factor which, along with the cross-sectional dimension, e.g., diameter, of the wire-bond, partly determines the impedance of the wire-bond structure. The thickness of the insulative coating can be greater, e.g., 50 microns, 75 microns, 100 microns, or another value, depending upon the diameter of the wire 166, the permeability of the insulative coating and the impedance value to be achieved.

Figure 2:
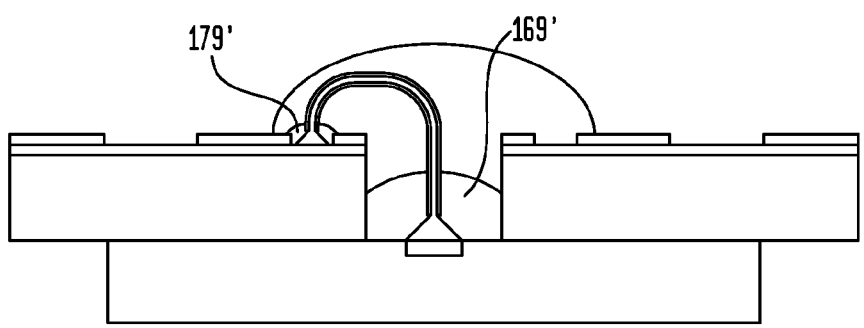
FIG. 2 is a sectional view of a microelectronic assembly in accordance with a variation of the embodiment shown in FIG. 1A.

Once wire-bonds 165 to the microelectronic device contacts have been formed, globs 169, 179 of dielectric material can be deposited to cover any portions of the microelectronic device contacts 112 and the contacts 175 of the interconnection element which may still be exposed. The amount of dielectric material can be limited to only that which is necessary to ensure that the contacts 112 and contacts 175 are fully insulated for subsequent processing. Therefore, the dielectric material could be relatively thin, i.e., not needing to be more than a few microns in thickness. Such insulating dielectric material layer could be deposited, for example, by a spin-on or spray-on process or by filling to a certain height. In one embodiment (FIG. 2), the insulating dielectric material 169', 179' could be deposited onto exposed portions of the contacts 112 and the element contacts 175 to a depth sufficient to insulate the contacts from subsequently deposited conductive material.

After such processing, a conductive layer 160 can be formed. In one example, a conductive encapsulant can be dispensed over insulated wire 165 to form the conductive layer 160. In one embodiment, the conductive layer 160 can encapsulate the insulated wire 165 in its entirety. In one embodiment, the conductive material can be a conductive paste, e.g., a silver paste, solder paste, or the like. In alternative embodiments, it might be a different material.

In one embodiment, the conductive layer 160 forms a conductive interconnection with contacts 180 of the interconnection element when the conductive layer 160 is formed. For example, contacts 180 on the interconnection element can be exposed at the time the conductive encapsulant is provided on the structure such that the encapsulant then makes electrically conductive contact with the contacts. When the contact 180 is a ground contact, the conductive encapsulant 160 provides a ground reference for transmission lines formed by the juxtaposition of the insulated wirebonds 165 and the ground reference through the conductive layer 160.

In accordance with the above-described structure, a transmission line structure is realized for insulated wirebonds 165 which connect with signal contacts on the interconnection element 130. Moreover, parameters of the structure can be selected so as to achieve a desired characteristic impedance. For example, in some electronic systems, a characteristic impedance of 50 ohms can be selected in order to meet signal interface requirements, such as when signals on an external interface are transmitted on transmission lines having 50 ohm characteristic impedance. In order to achieve the selected impedance, parameters can be selected such as the conductive properties of the metal, as well as the shape and thickness of the wire, the thickness of the dielectric insulating material, its dielectric constant, i.e., permeability, as well as the properties of the conductive layer 160, e.g., conductive encapsulant.

Figure 3A:
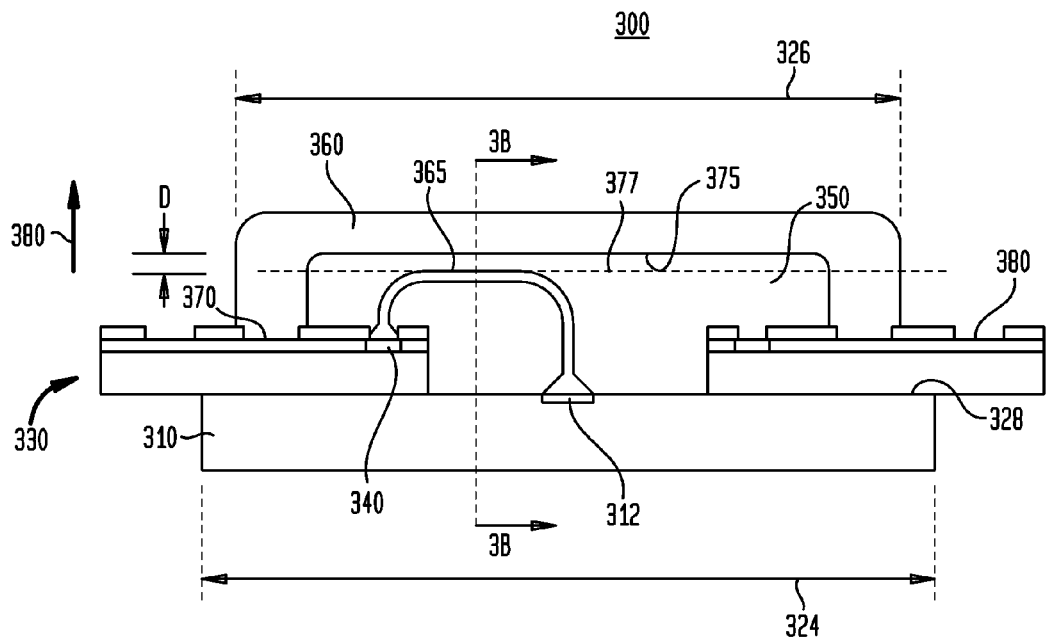
FIG. 3A is a sectional view of a microelectronic assembly in accordance with an embodiment.
Figure 3B:
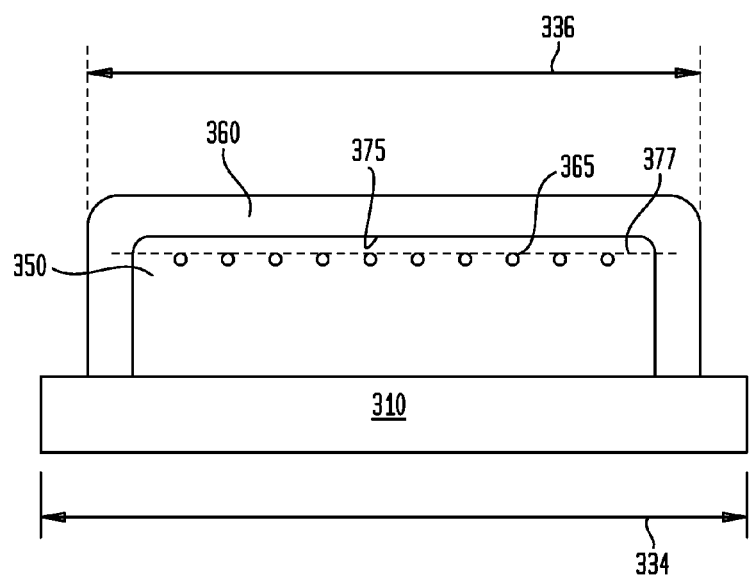
FIG. 3B is a sectional view along a section line transverse to the sectional view of FIG. 3A in the embodiment shown in FIG. 3A.
Figure 3C:
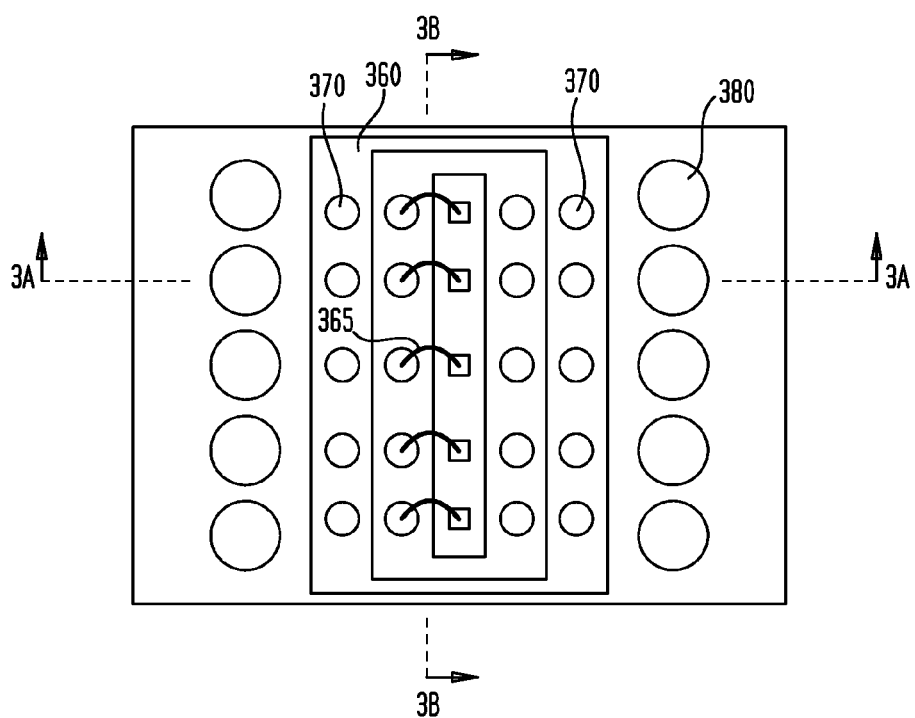
FIG. 3C is a plan view of the embodiment shown in FIGS. 3A-B.

The structure described above may be performed in the order described, or, alternatively, in a different order. In some implementations, two or more of the described steps may be combined into a single step. In other implementations, a described step may be excluded completely from the process. In yet other variants, additional processing steps may be required. In alternative implementations (not shown), at least one second microelectronic device could be disposed in the place of interconnection element 130 and be conductively connected to the microelectronic device 110 with insulated wires to achieve transmission line structures in like manner as in the above-described microelectronic assembly 100. In yet another alternative implementation, the contacts of two interconnection elements 130 could be conductively connected with insulated bond wires to achieve transmission line structures in a manner as described above. For example, the contacts of two or more circuit panels or two or more other interconnection components could be interconnected in such manner FIG. 3A shows a sectional view of an exemplary microelectronic assembly 300 that includes a plurality of impedance controlled wire-bonds. FIG. 3C shows a corresponding plan view from above, wherein FIG. 3A is a view through line 3A-3A of FIG. 3C. FIG. 3B is a sectional view through line 3B-3B of FIG. 3C, in a direction transverse to the section that is illustrated in FIG. 3A. Microelectronic assembly 300 includes microelectronic device 310 and interconnection element 330. Microelectronic device 310, in one embodiment, is similar to microelectronic device 110 described in connection with FIGS. 1A-B. In one embodiment, interconnection element 330 is similar to interconnection element 130 described in connection with FIGS. 1A-B.

As illustrated, a contact 312 at a surface 328 of a microelectronic device 310, e.g., a semiconductor die is wire-bonded to interconnection element 330 using a wire 365. The wire 365 typically is not insulated. As seen in FIG. 3B, typically a plurality of such wires 365 are bonded to microelectronic device 310 and to interconnection element 330 using conventional wire-bonding techniques. In one embodiment, the wires 365 can be different from the insulated wires 165 discussed above. In one embodiment, wires 365 may be typical of the types of wires used in a conventional wire-bonding process. For example, wires 365 may consist essentially of copper, gold, a gold-silver alloy, or some other metal or alloy of a metal with one or more other metals or materials or an alloy of a metal with one or more other metals and one or more other materials.

Wirebonds can be formed with relatively precise placement and within desirable tolerances such that parallel, closely spaced runs can be achieved which run parallel to the surface 328 of the die. As used herein, "parallel" denotes a structure which is parallel to another structure within manufacturing tolerances. For example, wirebonding equipment available from Kulicke and Soffa (hereinafter, "K&S") can be used to achieve precision wirebonds. Thus, wirebonds 365 can be formed which have runs which are perfectly straight in lateral directions above the chip surface or are close to being straight. While such precision can be achieved in forming the wirebonds, nothing is meant to require precisely formed parallel, straight wirebonds other than as specifically recited in the appended claims.

As seen in FIGS. 3A-C, in one embodiment, once the wires 365 have been wirebonded to microelectronic device 310 and interconnection element 330 a dielectric layer 350 is formed to cover and insulate the bond wires. The dielectric 350 in this case might be one of a number of different materials such as a polymer, e.g., an epoxy, or another dielectric material, etc. In one embodiment, dielectric material 350 fills the entire void between interconnection element 330 and microelectronic device 310.

As seen in FIG. 3B, the wirebonds 365 have runs which extend in directions into and out of the sheet on which FIG. 3B is printed. Thus, the runs of the wirebonds define a plane 377 that extends in directions as shown in FIGS. 3A-B. In one embodiment, the dielectric material can be formed on the interconnection element 330 and microelectronic device 310 by molding so as to produce a molded dielectric region having a surface remote from the microelectronic device surface 328, and form a surface which is at least substantially planar. Such remote surface of the dielectric layer can be spaced at an least a substantially uniform distance "D" in a vertical direction 380 from the plane 377 in which the wirebonds 365 run. Thus, the molded dielectric region may be formed in such manner that its surface which is remote from the microelectronic device surface 328 is parallel to runs of the wirebonds 365 over at least about 50% of the length of the wirebond.

Thereafter, a conductive layer 360 is formed over the dielectric layer 350. The conductive layer 360 can be provided by any of a variety of ways. The conductive layer 360 can extend along and abut the surface of the dielectric layer 350 as shown in FIGS. 3A-B, so as to have a conductive surface 375 in contact with above-described surface of the dielectric layer. In one example, the conductive layer can be formed by plating, sputtering or otherwise depositing a layer of metal onto a surface of the dielectric layer. In another embodiment, the conductive layer 360 can be formed by a conductive particle-filled thermosetting resin which is vacuum-formed within a forming cavity to a selected shape and distance above the wirebonds 365.

In a particular embodiment, the conductive layer is formed by applying a conductive paste, e.g., a silver paste, solder paste, or other conductive filled paste to exposed surfaces of the dielectric layer, such as by a dispensing, molding, screen-printing or stenciling process. Other examples of conductive pastes can include a conductive polymer or a polymer alloyed with host resins. In a particular example, the conductive paste might comprise an electric conductive powder, an organic binder (e.g. a polyhydroxystyrene derivative) and a thermo-setting resin. A possible benefit of using a conductive paste can be obtaining a finished product that may be lighter in weight. Fabrication might also be easier and less expensive if it can result in the elimination of secondary processes. In one embodiment, conductive layer 360 contacts a pad 370 on interconnection element 330. The pad might be a ground or power-supply pad. By contacting and forming a bond with the contact 180, the conductive layer becomes connected electrically to the interconnection element.

In one embodiment, dimensions of the conductive layer 360 in directions oriented horizontally with respect to the surface 328 of microelectronic device 310 can be smaller than corresponding dimensions of the microelectronic device surface 328. As seen in FIGS. 3A-B, the surface 328 of the microelectronic device has a first dimension 324 extending in a first direction and has a second dimension 334 extending in a second direction that is transverse to the first direction. The first and second directions extend horizontally with respect to the microelectronic device surface 328, that is, in directions along such surface. In such embodiment, the conductive layer 360 can have a dimension 326 in the first direction which is smaller than the corresponding first dimension 324 of the microelectronic device surface 328. Similarly, the conductive layer 360 can have a dimension 336 in the second direction which is smaller than the corresponding second dimension 334 of the microelectronic device surface 328.

In one embodiment, the conductive layer 360 can have a surface 375 which is disposed at at least a substantially uniform distance above at least substantial portions of the lengths of the wirebonds, such that each wirebond and the adjacent conductive layer, being tied to a source of reference voltage, forms a transmission line structure that has a desired characteristic impedance. In one embodiment, the conductive surface can be disposed at such substantially uniform distance from runs of the wirebonds which extend over 50% or more of the lengths of the wirebonds. In order to achieve a desired characteristic impedance, parameters can be selected such as the conductive properties of the metal used in the wire, as well as the shape and thickness of the wire, the thickness of the insulating material 350 between the wire and the conductive layer 360, the dielectric constant of the insulating material, i.e., permeability, as well as the thickness and properties of the conductive layer 360.

FIG. 3D graphs characteristic impedance $Z_0$, in ohms, versus separation distance, in inches, between a signal conductor or conductive element, e.g., a wire of cylindrical cross-section, and a reference conductor or conductive element, e.g., "ground plane". The reference conductor is assumed to be a planar structure that is large in comparison with the diameter of the signal conductor. FIG. 3D plots characteristic impedance for two different diameter wires. The plots in FIG. 3D can be derived from an equation that governs characteristic impedance in an arrangement having the present geometry. In such equation, the characteristic impedance $Z_0$ is given by $$Z_0 = \frac{138 \times \log(4H/d)}{\sqrt{\varepsilon_R}} \text{ ohms,}$$

where H is the separation distance between the wire and the conductive plane, d is the diameter of the wire and $\in_R$ is the permeability of the dielectric material that separates the wire from the conductive plane. The permeability $\in_R$ can vary depending on the type of dielectric material used. The separation distance H is a factor which can be at least partly determined by the process used to fabricate the microelectronic assembly. The wire diameter may be at least partly determined by the process used to fabricate the microelectronic assembly.

In FIG. 3D, the lower curve 320 plots the characteristic impedance when the wire used to form a wirebond has a thickness of 1 mil, i.e., 0.001 inch. The upper curve plots 322 the characteristic impedance when the wire used to form the wirebond has a thickness of 0.7 mil, i.e., 0.0007 inch. As seen in FIG. 3D, characteristic impedances lower than about 70 ohms are provided when a separation distance H between the wire and the conductive plane is less than or equal to about 0.002 inch (2 mils), i.e., about 50 microns. FIG. 3B shows a cross section of microelectronic assembly 300. This figure shows that multiple bondwires can be bonded from the interconnection element 330 to the microelectronic device 310 and that each of the thus formed wirebonds in the assembly 300 is surrounded by dielectric material 350. The conductive encapsulant, as illustrated, can cover the entire subassembly. In an alternative embodiment, the conductive encapsulant may only cover a portion of the dielectric material 350, such as a top surface of the dielectric material 350.

Figure 4A:
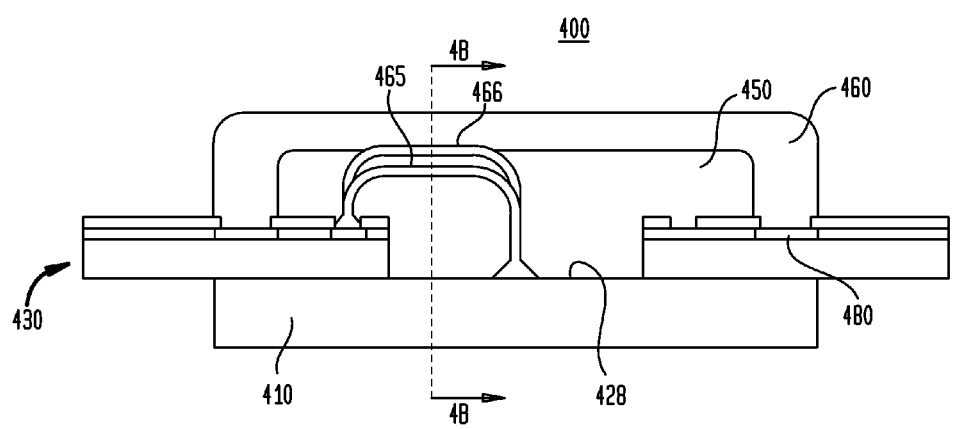
FIG. 4A is a sectional view illustrating a microelectronic assembly in accordance with a variation of the embodiment illustrated in FIGS. 1A-B.
Figure 4B:
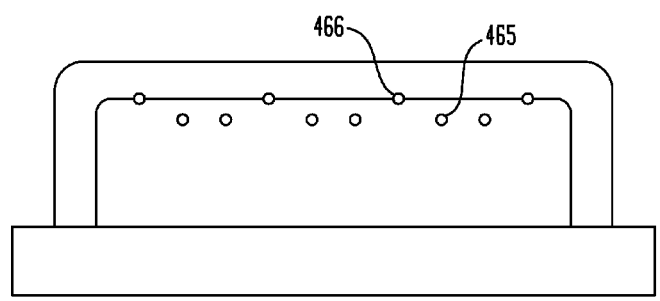
FIG. 4B is a sectional view along a section line transverse to the sectional view of FIG. 4A in the embodiment shown in FIG. 4A.

FIGS. 4A-4B show an alternative assembly 400 which represents a variation from the assembly 300 shown in FIG. 3. FIG. 4A is an elevational view and FIG. 4B is a corresponding sectional in a direction transverse to the view illustrated in FIG. 4A. As shown, two wires 465 and 466 are wire-bonded between respective pairs of contacts of the interconnection element 430 and the microelectronic device 410. In one embodiment, wire 465 is a signal wire (e.g. used to transfer signals between interconnection element 430 and microelectronic device 410) and the other wire 466 is a ground or power wire, i.e., a wire that is bonded to a ground or power contact of the interconnection element 430.

In one embodiment, a reference wirebond 466 is formed such that it extends to a higher location above the contact-bearing surface 428 of microelectronic device 410 than wire 465. Accordingly, when dielectric material 450 is provided over wires 465 and 466, wire 466 is not completely covered by the dielectric material 450. Consequently, the wire 466 remains at least partially exposed when the conductive layer 460 is formed. Then, when the conductive layer 460 is formed, the layer 460 contacts the wire 466 and forms an electrically conductive connection with the wire. The wire 466 may be connected to respective reference contacts (e.g., ground contacts or voltage supply contacts) on the microelectronic device and the interconnection element. As further seen in FIG. 4A, the conductive layer is connected to a reference contact 480 (e.g., a ground or power contact pad) of the interconnection element. In such way, the conductive layer can act as a reference conductor for a transmission line that includes the signal wire 465 and the reference wire 466 and may also include the conductive layer 460 as a part of the transmission line. Because the reference wire 466 is also connected to a contact on the microelectronic device 410, the transmission line formed by the signal and reference wires 465, 466 extends to the contacts on the microelectronic device.

Figure 4C:
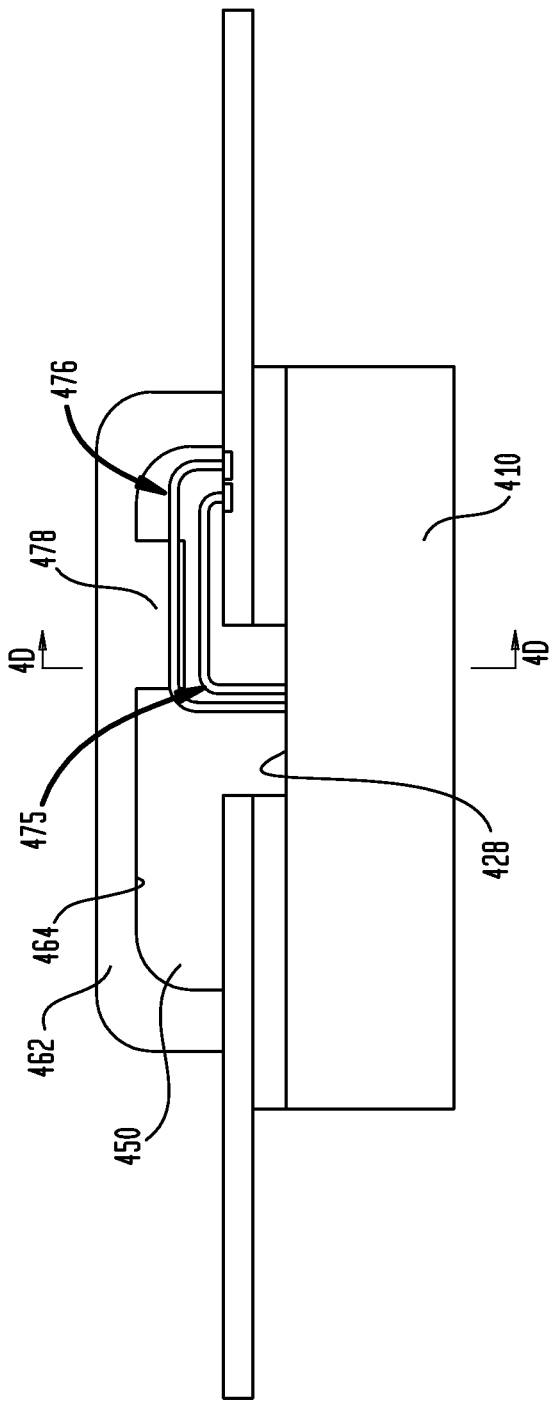
FIG. 4C is a sectional view illustrating a microelectronic assembly in accordance with a variation of the embodiment illustrated in FIGS. 4A-B.

FIG. 4C is a sectional view illustrating a variation of the embodiment shown in FIGS. 4A-B. As seen in FIG. 4C, as in FIGS. 4A-B discussed above, the reference wire 476 extends to a higher location above the surface 428 of the microelectronic device than a signal wire 475. As also seen in FIG. 4C, the conductive layer 462, like the conductive layer 460 of FIGS. 4A-B, presents an at least generally planar surface 464 in contact with the insulating dielectric layer 450. The conductive layer 462 additionally has a contacting portion 478 which extends downwardly away from surface 464 towards the microelectronic device 410. Such contacting portion 478 has an electrically conductive connection with the reference wire 466 but is insulated from the signal wire 475.

The conductive layer 462 with contacting portion 478 as shown in FIG. 4C can be formed as follows. The signal wire and reference wire are formed and a dielectric encapsulant layer 450 can be formed thereon, which has at least sufficient hardness to resist flowing in subsequent processing. Then, a trench is formed extending downward from an outer surface of the dielectric encapsulant material which exposes the reference wire 476. For example, a mechanical or laser process can be used to remove material from the encapsulant layer. Subsequently, when the conductive layer 462 is formed, the conductive material extends downward into the trench and forms an electrically conductive connection between the conductive layer 462 and the reference wire 466.

Figure 4D:
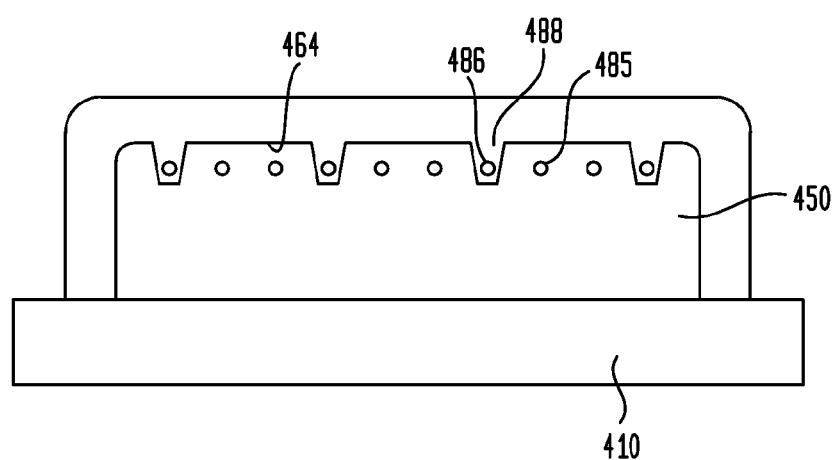
FIG. 4D is a sectional view transverse to the sectional view of FIG. 4C, illustrating a microelectronic assembly in accordance with a particular embodiment.

FIG. 4D illustrates a variation of the embodiment described with respect to FIG. 4C. FIG. 4D is a transverse sectional view that is taken in a direction that corresponds to direction line 4D-4D of FIG. 4C, such that the signal wires 485 and the reference wires 486 appear to run in directions into and out of the plane of the sheet on which FIG. 4D is printed. In the variation shown in FIG. 4D, the runs of the reference wires 486 lie substantially in the same plane as the runs of the signal wires 485. The contacting portions 488 are disposed in trenches which extend downwardly towards the microelectronic device 410 from the at least generally planar surface 464 of the conductive layer such that the reference wires are disposed in contact with the conductive material of the contacting portions, while the signal wires 485 are disposed in contact with the dielectric encapsulating material 450.

FIG. 4E illustrates a variation of the embodiment (FIG. 4D) in which the reference wire 496 and the signal wire 495 have runs which are disposed at least substantially within the same plane above the surface 428 of the microelectronic device 410, but in which a reference wire 496 extends in a direction opposite a direction 495 in which the signal wire extends. The contact between the reference wire 496 and the conductive layer 460 can be used to establish a stable reference voltage along the length of the reference wire 496 and on the surface 464 of the conductive layer. Consequently, the reference wire 496 acts as a reference conductor for the signal wire for the portion 491 of the signal wire 495 that extends in an upward direction from the microelectronic device 410. On the other hand, and the conductive layer 460 acts as the reference conductor for the other portion of the signal wire that extends in a direction along the surface 428 of the microelectronic device and at least generally to the surface 464 of the conductive layer 460.

In the variation shown in FIG. 4F, the reference wire 496' can include an upwardly extending portion 497 or "kinked" portion, rather than just extending in a direction generally parallel to the surface 428 of the microelectronic device 410. Such shape can help assure that a good electrically conductive connection is established between the reference wire 496' and the connecting portion 498 of the conductive layer.

Figure 4G:
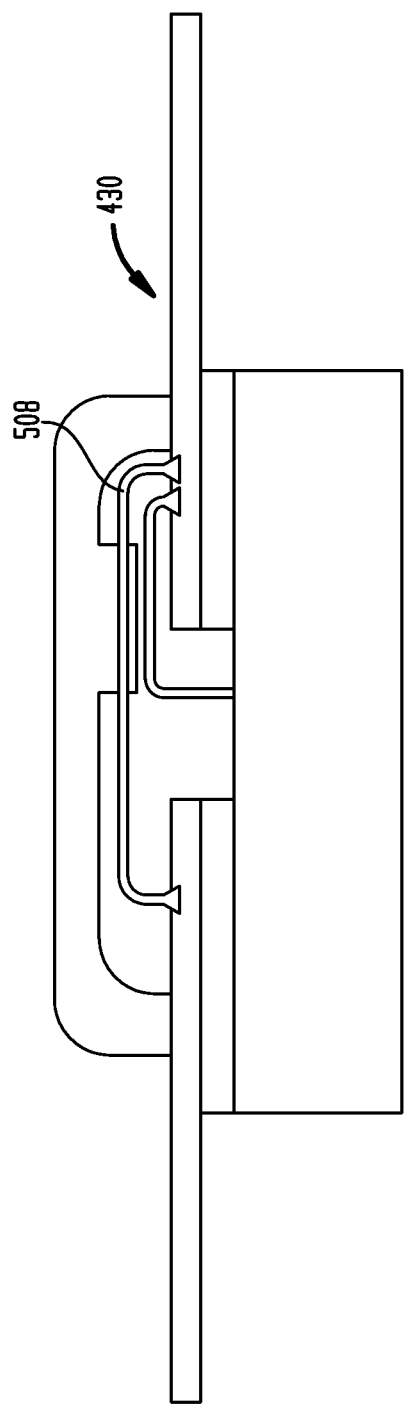
FIG. 4G is a sectional view illustrating a microelectronic assembly in accordance with a variation of the embodiment illustrated in FIG. 4C.

In the variation shown in FIG. 4G, the reference wire 508 has electrically conductive connections at each end to the substrate or interconnection element. Other features of this variation are as described above with reference to one or more of FIGS. 4A-F.

Figure 5:
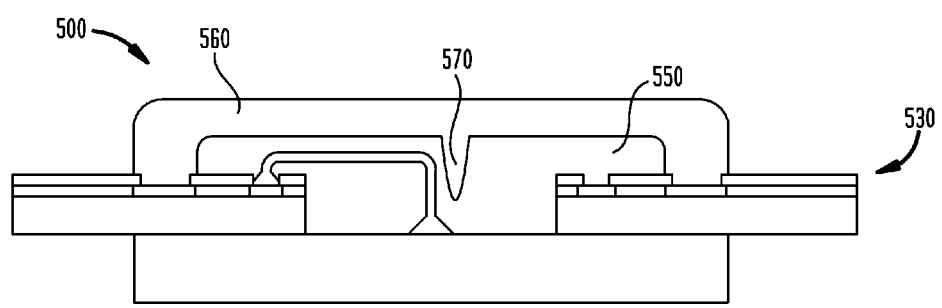
FIG. 5 is a sectional view illustrating a variation of the embodiment illustrated in FIGS. 3A-C.

FIG. 5 illustrates an alternative embodiment of a microelectronic assembly 300. Here, microelectronic assembly 500 includes microelectronic device 510 and interconnection element 530. In this embodiment, the dielectric material 550 includes a groove 570. This groove can be molded into the assembly as the dielectric layer 550 is formed. Alternatively, groove 570 is cut after the dielectric has cured. Groove 570 could be cut via drilling, sawing, or some other technique. In this embodiment, when the conductive layer 560 is formed, the conductive layer extends into groove 570. The conductive layer may then include conductive material within the groove disposed adjacent to rising portions of wirebonds, that is, adjacent to portions of a plurality of wirebonds which rise in a vertical direction away from the microelectronic device surface, as shown in FIG. 5.

Figure 6:
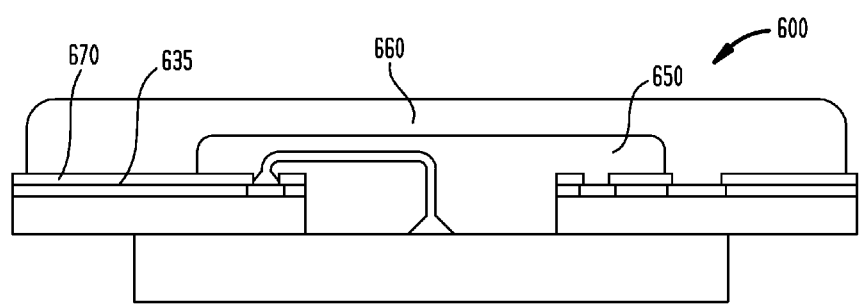
FIG. 6 is a sectional view illustrating a variation of the embodiment illustrated in FIGS. 3A-C.

FIG. 6 illustrates another alternative embodiment of interconnection element 300. Here, conductive layer 660 is extended to overlie the traces 635 on interconnection element 630, as insulated therefrom by dielectric layer 670, e.g., a patterned dielectric layer such as solder mask. Doing so extends the impedance control and shielding to the traces.

FIG. 7 illustrates a microelectronic assembly 700 according to yet another alternative embodiment. Here, the dielectric layer 750 includes slots or grooves 770 extending downwardly from a top surface thereof. The grooves can extend in a direction parallel to the runs of the wirebonds 765, i.e., in directions into and out of the plane defined by the page on which FIG. 7 is printed. The grooves can be formed, for example, at the time the dielectric layer is formed, e.g., such as, for example, when dielectric material is dispensed. Alternatively, the grooves can be formed after the dielectric material has been dispensed or cured. When the conductive layer 760 is formed, it can extend into grooves 770 and can provide shielding between wires.

FIG. 8 illustrates a microelectronic assembly 800 according to another alternative embodiment. Here, microelectronic device 810 is wire-bonded in a face-up orientation with interconnection element 830. Here, a rear face of the microelectronic device is attached to the interconnection element, and wirebonds extend from contacts 815 on the microelectronic device to corresponding contacts 875 of the interconnection element, the subassembly contacts 875 being disposed beyond edges 812 of the microelectronic device.

In one embodiment, a stack of microelectronic devices 810 can be stacked one on top of the other. Wire bonds can be formed between a microelectronic device 810 and a corresponding interconnection element 830. Then, a dielectric layer 850 can be formed, and then a conductive layer 860 can be formed. Such layers can be formed so as to leave stack interconnection terminals such as for example, stack contacts (not shown) exposed on the interconnection element 830. Then, a second completed microelectronic assembly 800 can be stacked on top of the second dielectric layer, e.g., so that the microelectronic devices in each assembly 800 is in a face-up orientation. The second microelectronic assembly can be conductively interconnected with the first microelectronic assembly with conductive elements extending between the stack interconnection terminals.

Figure 9:
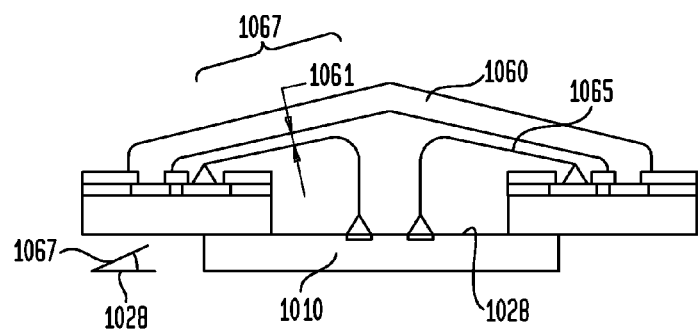
FIG. 9 is a sectional view illustrating a microelectronic assembly in accordance with a variation of the embodiment illustrated in FIGS. 3A-C.

FIG. 9 illustrates a variation of the above embodiment (FIGS. 3A-B) in which signal wires 1065 extend in runs along the surface 1028 of the microelectronic device 1010, where the runs 1067 are not parallel to the plane of the surface 1028. Instead, the runs 1067 of the wire bonds are canted at an angle relative to the surface 1028. In this case, the conductive layer 1060 can extend parallel to the runs 1067 at a spacing 1061 which is uniform or at least substantially uniform along 50% or more of the length of the wire bonds. In this way, a transmission line structure is achieved which has a beneficial characteristic impedance. The fabrication method can be the same as described with respect to FIGS. 3A-B above, except that a mold having a gabled shape can be used to mold the dielectric encapsulant layer 1050 prior to forming the conductive layer.

Figure 10:
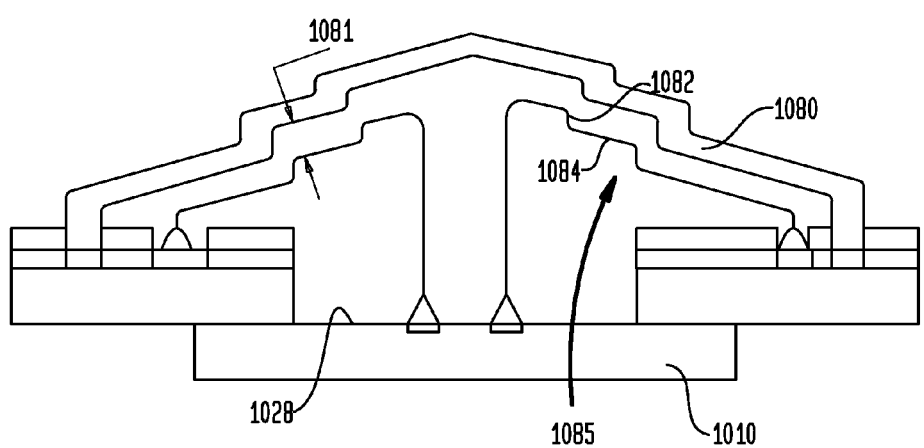
FIG. 10 is a sectional view illustrating a microelectronic assembly in accordance with a variation of the embodiment illustrated in FIGS. 3A-C.

FIG. 10 illustrates yet another variation in which the wire bonds 1085 do not extend in uniformly linear runs. Instead, the wire bonds have a stair-step shape that includes relatively short jogs 1082 which extend mostly downwardly and somewhat longer jogs or steps 1084 which extend in directions across the surface 1028 of the microelectronic device 1010. In this case, as well, the conductive layer can be arranged to have a stair-step shaped inner surface adjacent to the wirebonds 1084, such inner surface being defined by a series of similar steps which follow the contours of the wirebonds. As a result, the inner surface of the conductive layer 1080 can extend parallel to the jogs 1084 of the wirebonds at a spacing 1081 which is uniform or at least substantially uniform along 50% or more of the length of the wire bonds. Again, the same method as described above (FIGS. 3A-B) can be used to fabricate the structure except that a mold having a different shape can be used to form the stair-step shaped conductive layer.

Figure 11A:
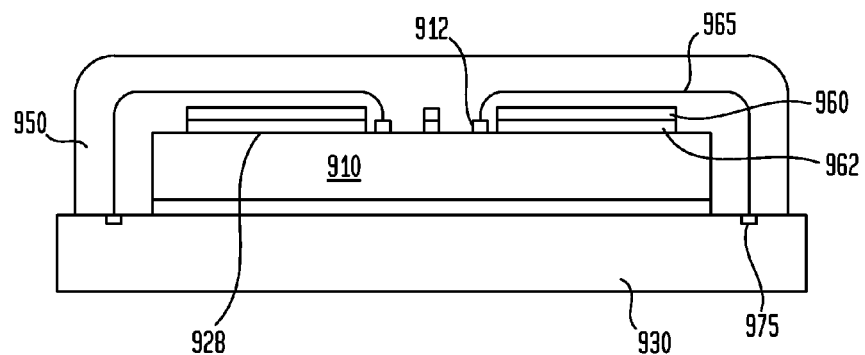
FIG. 11A is a sectional view of a microelectronic assembly in accordance with another embodiment.
Figure 11B:
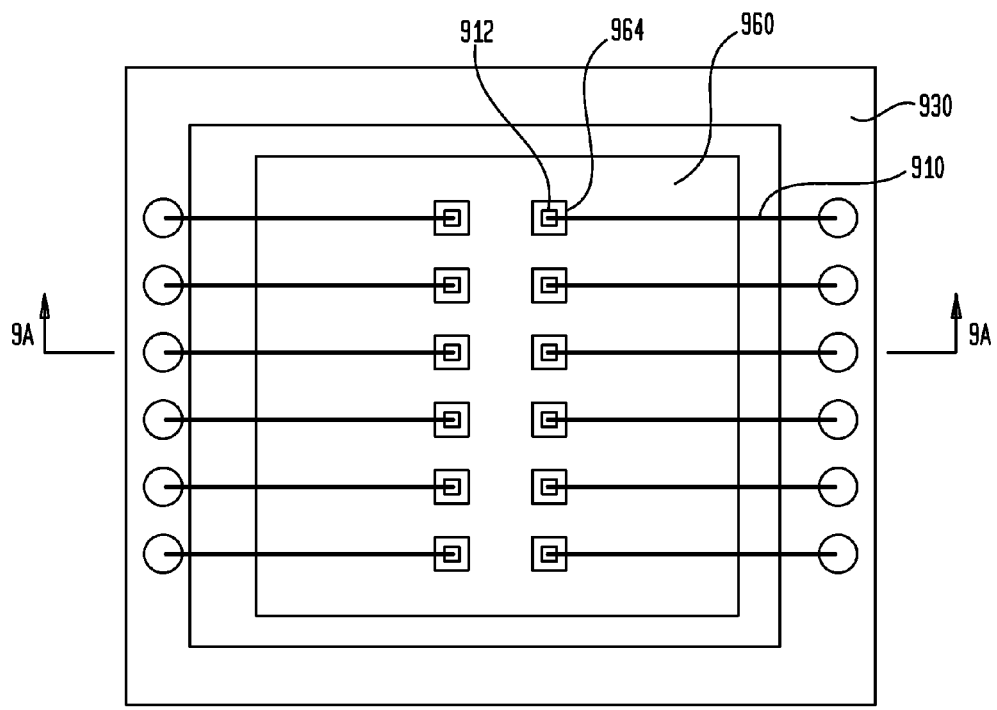
FIG. 11B is a plan view corresponding to the sectional view of FIG. 11A in accordance with one embodiment.

In the embodiment illustrated in FIGS. 11A-11B, a conductive plane 960 extends along a surface 928 of a microelectronic device 910 and wirebonds 965 connected to contacts 912 of the microelectronic device extend parallel to the surface 928 at a spaced distance from the conductive plane 960. FIG. 11A is a sectional view illustrating a microelectronic assembly 900 including microelectronic device 910 and interconnection element connected therewith. FIG. 11B is a plan view from above the surface 928 and looking towards the surface towards contacts 912. As seen in FIGS. 11A-B, the conductive plane can include openings 964 which expose individual ones of the contacts 912. Alternatively, the conductive plane can include one or more larger openings which expose some or all of the contacts of the microelectronic device.

In one embodiment, the conductive plane can be formed by processing applied to the surface 928 of a microelectronic device such as a metal deposition or plating process applied to the device while the device is in form of a wafer or panel containing a plurality of connected devices or after the device has been singulated from other such devices. Alternatively, the conductive plane can be provided by pre-processing a metal sheet such as a copper foil, for example, to form openings 964 in the metal sheet. Then, the metal sheet can be bonded to the surface 928 of the microelectronic device, such as by using an adhesive.

Wirebonds 965 are then formed which connect the contacts 912 of the microelectronic device with the contacts 975 on the microelectronic device 910. As seen in FIG. 11A, the wirebonds 965 have runs which are raised above the surface 928 of the microelectronic device. After forming the wirebonds, a dielectric layer 950 can be formed, such as for the purpose of mechanically supporting the wirebonds. The runs of the wirebonds 965 can extend in a horizontal direction parallel to or at least generally parallel to the microelectronic device surface 928 as shown in FIG. 11A. In this case, the runs may be parallel within manufacturing tolerances therefor. Such horizontal runs typically are substantial portions of the wirebonds, i.e., 50% of the lengths of the wirebonds or greater. The runs can be spaced at a substantially uniform height above the conductive plane, e.g., typically a height of about 50 micrometers from the surface 928 to about 100 micrometers from the surface 928. In such way, a desired impedance can be achieved for the wirebonds. In such way, signals to and from the microelectronic device may be transmitted with less noise entering the connections (e.g., wirebonds) carrying the signals.

Figure 12:
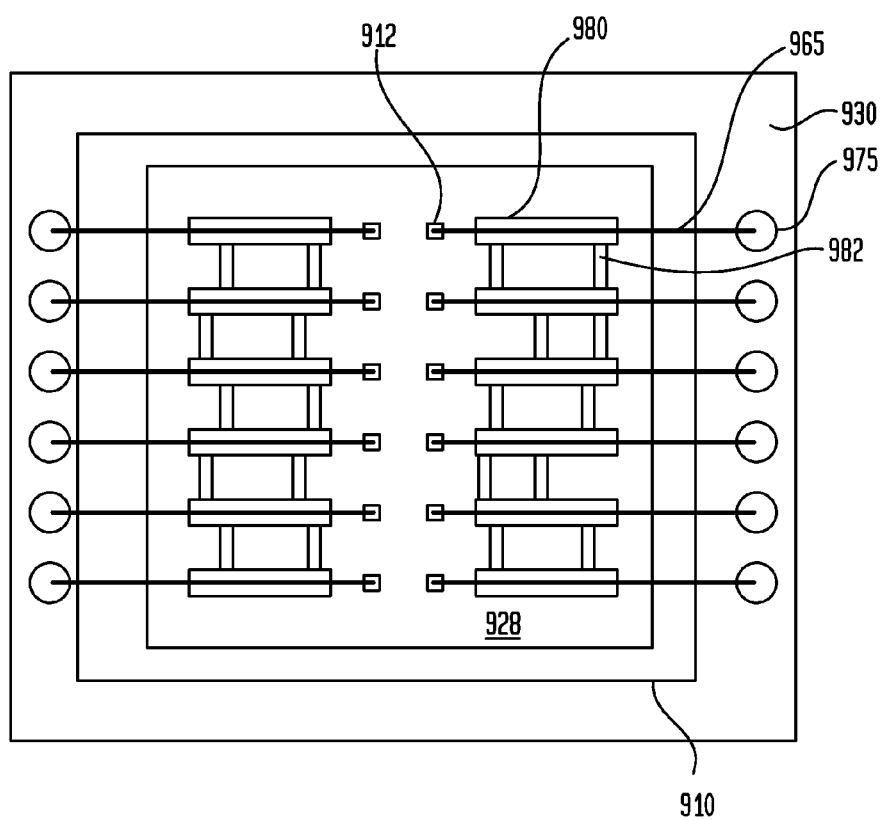
FIG. 12 is a plan view illustrating a microelectronic assembly in accordance with a variation of the embodiment illustrated in FIGS. 11A-B.

The variation shown in FIG. 12 demonstrates that it is not necessary for conductive layer to be an intact metal sheet. Instead, as seen in FIG. 12, the conductive layer can be provided in form of a plurality of conductive strips 980 which extend along the surface of the microelectronic device 910 in directions parallel to runs of the signal wire bonds 965 between the device contacts 912 and the contacts 975 of the interconnection element 930. The conductive strips can be mechanically supported or held together with supporting portions 982. In one embodiment, the conductive strips and supporting portions are formed as a metallic structure by subtractively patterning a copper foil or sheet and bonding the remaining metallic structure to the surface 928 of the microelectronic device, such as with an adhesive material 962.

The foregoing embodiments have been described with respect to the interconnection of individual microelectronic devices, e.g., semiconductor chips. However, it is contemplated that the methods described herein may be employed in a wafer-scale manufacturing process applied simultaneously to a plurality of chips connected together at edges of the chips, such as a plurality of chips connected together at edges in form of a unit, panel, wafer or portion of a wafer.

In a particular variation of the above-described embodiments, the conductive material need not conform to the contours of the dielectric region which surrounds the wirebonds. For example, instead of forming the conductive layer on a molded dielectric region, the conductive layer can be realized by attaching a metal can to overlie the bond wires and dielectric region 350 so as to place the interior surface of the metal can at a desired spacing from the wirebonds 365 of the microelectronic assembly.

While the above description makes reference to illustrative embodiments for particular applications, it should be understood that the claimed invention is not limited thereto. Those having ordinary skill in the art and access to the teachings provided herein will recognize additional modifications, applications, and embodiments within the scope of the appended claims.

The invention claimed is:

1. A microelectronic assembly comprising:
   a semiconductor die having microelectronic circuitry thereon, the semiconductor die having a front surface and a rear surface remote therefrom and device contacts exposed at the front surface, and one or more surface conductive elements supported by the semiconductor die and extending along the front surface, wherein the one or more surface conductive elements includes a metal layer at the front surface of the semiconductor die extending along the front surface, each surface conductive element having a planar surface parallel to the front surface;
   an interconnection element underlying the rear surface of the semiconductor die, the interconnection element having a plurality of element contacts thereon;
   a plurality of wire bonds connecting the device contacts with the element contacts, the wire bonds disposed above the one or more surface conductive elements, the wire bonds having substantial portions extending at least generally parallel to the one or more surface conductive elements,
   wherein the one or more surface conductive elements is connectable to a source of reference potential, such that a desired impedance is achieved for the wire bonds.

2. The microelectronic assembly as claimed in claim 1, wherein the one or more surface conductive elements consists essentially of metal.

3. The microelectronic assembly as claimed in claim 1, wherein the one or more surface conductive elements is exposed at the front surface.

4. The microelectronic assembly as claimed in claim 2, wherein the one or more surface conductive elements includes openings, wherein the wire bonds connect to the device contacts through the openings in the one or more surface conductive elements.

5. The microelectronic assembly as claimed in claim 2, wherein the one or more surface conductive elements comprises a conductive metal plane.

6. The microelectronic assembly as claimed in claim 2, wherein the one or more surface conductive elements comprises a plurality of conductive metal strips.

7. The microelectronic assembly comprising:
   a semiconductor die having microelectronic circuitry thereon, the semiconductor die having a front surface and a rear surface remote therefrom and device contacts exposed at the front surface, and a plurality of metal strips supported by the semiconductor die and extending along the front surface, each metal strip having a planar surface parallel to the front surface;
   an interconnection element including a dielectric element underlying the rear surface of the semiconductor die, the interconnection element having a plurality of element contacts thereon;
   a plurality of wire bonds connecting the device contacts with the element contacts, the wire bonds extending in runs spaced a first height above the front surface and above the one or more metal strips and at least generally parallel to the metal strips such that the metal strips are between the semiconductor die and the wire bonds,
   wherein the metal strips are connectable to a source of reference potential, such that a desired impedance is achieved for the wire bonds.

8. The microelectronic assembly as claimed in claim 7, wherein the metal strips are exposed at the front surface.

9. The microelectronic assembly as claimed in claim 7, wherein the metal strips include openings, wherein the wire bonds connect to the device contacts through the openings in the metal strips.

10. The microelectronic assembly as claimed in claim 8, wherein the metal strips include openings, wherein the wire bonds connect to the device contacts through the openings in the metal strips.

11. The microelectronic assembly as claimed in claim 7, wherein the semiconductor die and the metal strips are bonded together.

12. The microelectronic assembly as claimed in claim 11, wherein the semiconductor die and the metal strips are bonded together with an adhesive.

* * * * *